(12) United States Patent
Annequin (10) Patent No.: US 10,700,480 B2
(45) Date of Patent: Jun. 30, 2020

(54) ELECTRICAL IMPEDANCE MATCHING PART FOR CONNECTOR MOUNTED ON CABLE WITH INSULATED ELECTRICAL WIRES

(71) Applicant: RAYDIALL, Voiron (FR)

(72) Inventor: Sébastien Annequin, Saint Nicolas de Macherin (FR)

(73) Assignee: RAYDIALL, Voiron (FR)

( * ) Notice: Subject to any disclaimer, the term of this patent is extended or adjusted under 35 U.S.C. 154(b) by 0 days.

(21) Appl. No.: 16/208,932

(22) Filed: Dec. 4, 2018

(65) Prior Publication Data

US 2019/0173243 A1 Jun. 6, 2019

(30) Foreign Application Priority Data

Dec. 6, 2017 (FR) ..................... 17 61713

(51) Int. Cl.
| | |
|---|---|
| *H01R 24/44* | (2011.01) |
| *H01R 13/6473* | (2011.01) |
| *H05K 1/02* | (2006.01) |
| *H01B 11/02* | (2006.01) |
| *H01R 13/6591* | (2011.01) |

(Continued)

(52) U.S. Cl.
CPC ............ *H01R 24/44* (2013.01); *H01B 11/02* (2013.01); *H01R 13/6473* (2013.01); *H01R 13/6474* (2013.01); *H01R 13/6591* (2013.01); *H01R 43/048* (2013.01); *H05K 1/0237* (2013.01);

(Continued)

(58) Field of Classification Search
CPC ............... H01R 24/44; H01R 13/6473; H01R 13/6474; H01R 13/6591; H01R 13/6593; H01R 2103/00; H01B 11/02; H05K 1/0237
USPC ............ 439/607.01, 607.47, 607.48, 607, 5, 439/607.54, 607.55, 56, 203, 204, 877, 439/878, 730, 741
See application file for complete search history.

(56) References Cited

U.S. PATENT DOCUMENTS

| | | | | |
|---|---|---|---|---|
| 3,675,188 A | * | 7/1972 | Startin ..................... | H01R 4/20 439/730 |
| 5,495,075 A | * | 2/1996 | Jonckheere ............ | H01R 9/032 174/74 R |

(Continued)

FOREIGN PATENT DOCUMENTS

| | | |
|---|---|---|
| EP | 3 232 447 A | 10/2017 |
| JP | 2004-071404 A | 3/2004 |

(Continued)

OTHER PUBLICATIONS

French Preliminary Search Report dated Aug. 9, 2018 from Corresponding French Application No. FR 1761713.

*Primary Examiner* — Harshad C Patel (74) *Attorney, Agent, or Firm* — Pearne & Gordon LLP (57) ABSTRACT

An electrically conductive part, intended to provide electrical impedance matching when connecting a connector with a cable, comprises at least one pair of twisted electrical wires, comprising a front portion, the shape of which has a continuous outer profile and which defines on the inside at least two housings, each of which is suitable for housing the unstripped portion of a cable wire; and a rear portion, extending from the front portion, the shape of which has a discontinuous outer profile defined by fins taking a shape that is complementary to that of the unstripped portion of the wire of a cable.

8 Claims, 10 Drawing Sheets

(51) Int. Cl.
*H01R 43/048* (2006.01)
*H01R 13/6474* (2011.01)
*H01R 103/00* (2006.01)
*H01R 4/18* (2006.01)
*H01R 13/6593* (2011.01)

(52) U.S. Cl.
CPC .......... *H01R 4/185* (2013.01); *H01R 13/6593* (2013.01); *H01R 2103/00* (2013.01)

(56) References Cited

U.S. PATENT DOCUMENTS

| | | | |
|---|---|---|---|
| 7,837,494 B2* | 11/2010 | Vich | H01R 4/26 439/419 |
| 7,906,730 B2* | 3/2011 | Atkinson | H01R 13/6592 174/78 |
| 9,362,632 B2* | 6/2016 | Sunaga | H01R 9/032 |
| 9,490,588 B2* | 11/2016 | Keyser | H01R 13/6592 |
| 9,496,667 B2* | 11/2016 | Gardner | H01R 9/035 |
| 9,859,659 B2* | 1/2018 | Resendez | H01R 9/035 |
| 10,188,020 B2* | 1/2019 | Kondo | H01B 7/00 |
| 2010/0294530 A1* | 11/2010 | Atkinson | H01R 9/034 174/78 |
| 2011/0300750 A1* | 12/2011 | Nagawatari | H01R 9/035 439/607.01 |
| 2012/0285723 A1* | 11/2012 | Gundel | H01B 7/0861 174/113 R |
| 2017/0332525 A1 | 11/2017 | Kondo | |

FOREIGN PATENT DOCUMENTS

| | | |
|---|---|---|
| JP | 2004-079377 A | 3/2004 |
| WO | 2017/082021 A1 | 5/2017 |

\* cited by examiner

ELECTRICAL IMPEDANCE MATCHING PART FOR CONNECTOR MOUNTED ON CABLE WITH INSULATED ELECTRICAL WIRES

TECHNICAL FIELD

The present invention relates to the field of power and/or data transmission connector technology.

It relates more particularly to a connector, the central contacts of which are crimped to electrical cable wire ends.

The invention applies in particular to connector technology for data transmission implementing cables comprising a pair of shielded or unshielded transmission wires.

The invention applies more generally to any type of connector technology for transmitting electrical signals and/or data and/or radiofrequency (RF) signals.

One advantageous application is connector technology for motor vehicles.

PRIOR ART

In the field of connector technology for transmitting electrical signals and/or data and/or radiofrequency (RF) signals, connectors with an electrically insulating block in which central contacts are pre-mounted that are each intended to be crimped around a stripped end of an electrical cable wire are known.

Figure 1A:
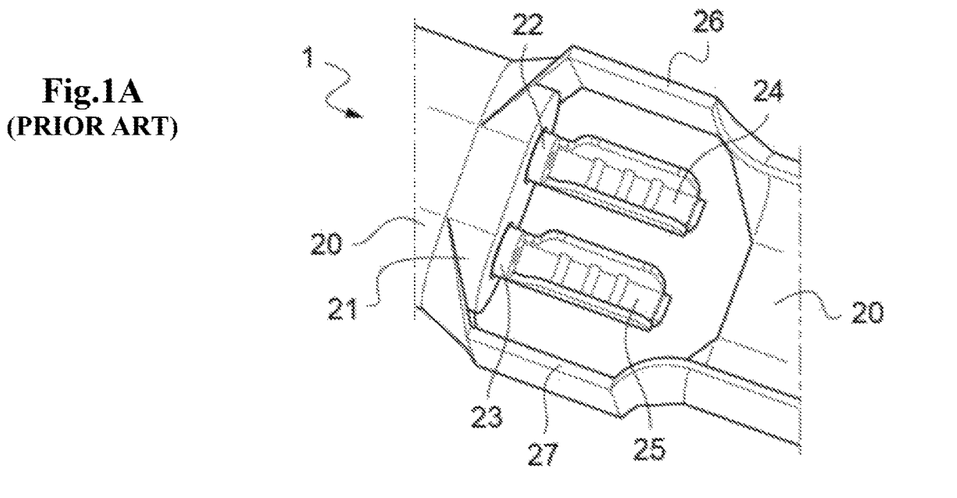
FIGS. 1A and 1B are partial perspective views of a first example of a connector with crimped central contacts according to the prior art.
Figure 1B:
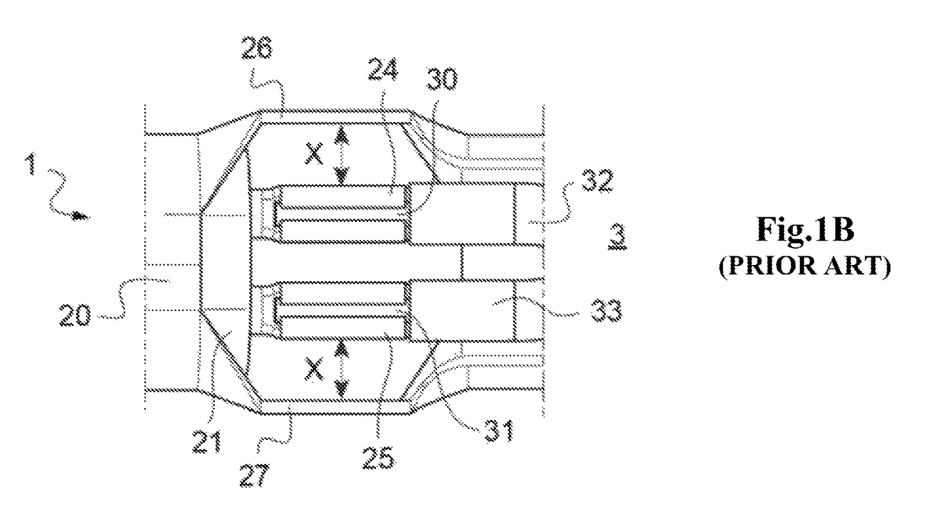
Figure 2:
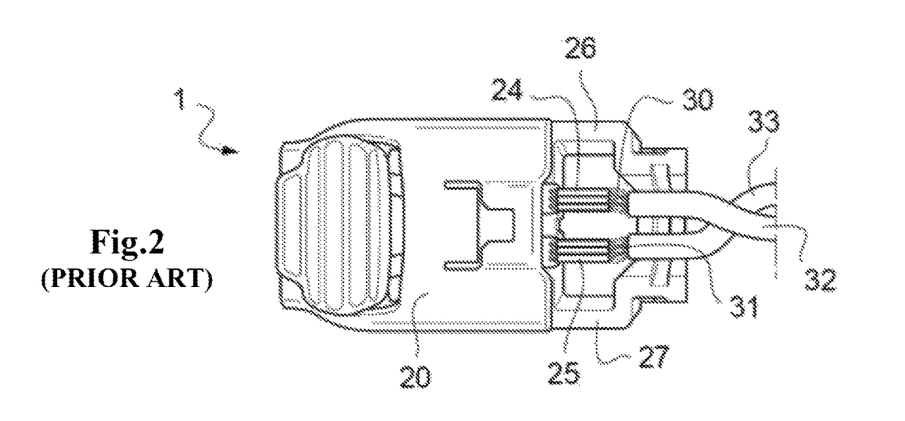
FIG. 2 is a perspective photographic reproduction of a second example of a connector with crimped central contacts according to the prior art.

FIGS. 1A, 1B and 2 show two examples of this type of currently existing connector technology.

The connector 1 first comprises a body 20 in which an insulating block 21 is housed inside which central contacts 22, 23 are pre-mounted. In the example illustrated in FIGS. 1A and 1B, the body 20 is made of metal, while in the example of FIG. 2, it is made of an insulating plastic material To provide the connection with an electrical cable 3, the end portions 24, 25 of the central contacts 22, 23 are crimped around stripped wire core ends 30, 31 of a cable 3. As can be seen in FIG. 1B, each wire of the cable 3 comprises an electrically conductive core 30, 31 that is coated with an electrically insulating layer 32, 33.

Additionally, each body 20 extends at the rear beyond the central contacts 22, 23 by means of extension walls 26, 27, which extend on either side of the periphery of the central contacts 22, 23.

This type of connector has two major drawbacks which result from the restricted space defined between the central contacts and the extension walls 26, 27.

This restricted space with a distance X between the periphery of the central contacts 22, 23 and the walls 26, 27 provides very limited room for the jaws of a crimping tool for simultaneously crimping the central contacts 22, 23.

In other words, this restricted space does not allow broad and robust crimping jaws to be used. A consequence of this is that the service life of the crimping jaws used is decreased and that the jaws often break because of the increase in the residual stresses caused by the crimping forces.

Additionally, the restricted space defined by the walls 26, 27 may heavily degrade the transmission of the signal that flows from the wires 30, 31 of the cable 3 into the central contacts 22, 23. Specifically, because it is not physically possible to get closer to the central contacts 22, 23 due to the risk of breaking the jaws, the distance X is enough to result in an increased impedance which degrades the electrical signal.

By way of example, in the case of connector technology for a motor vehicle, using the example of connector 1 in FIGS. 1 and 2, the impedance in the zone between walls 26, 27 and central contacts 22, 23 may be of the order of 100 ohms.

There is therefore a need to improve the connector technology solutions using connectors with central contacts that are crimped around stripped wire ends of cables for transmitting electrical signals and/or data and/or RF signals, in particular in order to remove the risk of breaking the crimping jaws and/or to eliminate or at least substantially decrease signal transmission degradation.

The aim of the invention is to at least partly meet this need.

DISCLOSURE OF THE INVENTION

To achieve this, the present invention relates to an electrically conductive part, intended to provide electrical impedance matching when connecting a connector with an electrical cable comprising at least one pair of twisted electrical wires, comprising:
- a front portion including at least two cavities, each of which is suitable for housing the unstripped portion of one of the pair of twisted electrical wires of the electrical cable;
- a rear portion, extending from the front portion, including fins taking a shape that is complementary to that of the unstripped portion of the one of the pair of twisted electrical wires a of the electrical cable.

The inventor has defined a connector with two half-shells.

After having defined this connector, the inventor observed that, additionally, the space between the two half-shells and the stripped wires could allow an electrically conductive electrical impedance matching part to be mounted, the shape of which part would conform as closely as possible to the wires of the electrical cable so as to guarantee optimal impedance matching. The fins are essentially cylindrical housing which conform as closely as the shape of the electrical insulating of the cable wires. This part makes it possible to precisely control the distance between the conductive cores of the wires and the electrical ground of the connector.

Thus, the part according to the invention is intended to match the impedance of the connection in the zone between the end of the sheath of the cable and the crimping zone of the central contacts. To achieve this, the part according to the invention makes it possible to decrease the distance between the cores of the electrical wires and the electrical ground of the connector in the zone between the end of the sheath of the cable and the crimping zone of the central contacts.

This impedance matching part according to the invention therefore makes it possible to recreate an electrical ground closer to the cable as is formed by a metal strip and/or braid initially present in the cable and wound around the electrical insulators of the wires but which is/are stripped for the operations of crimping the wire ends inside the central contacts.

Specifically, the impedance in a connector is determined by the space comprised between both the electrical ground defined by the ground contact forming body of the connector or by the two assembled half-shells of the connector such as described above and the electrically conductive core of each of the wires of the cable that carry a signal.

The greater the size of this space between the electrical ground and the core of each wire through which the signal is transmitted, the higher the impedance.

Now, the optimal position of the cable corresponds to an electrical ground position that conforms as closely as possible to the wires as found in the cable construction itself, which incorporates a metal strip or braid that is wound around the insulating layer of the wires of the cable in order to guarantee the impedance thereof.

However, when it is desired to strip the wires in order to carry out the operations of crimping them with the central contacts, it is necessary to locally remove the strip or the braid in order to separate the wires from one another.

Because of this, once the cable has been mounted in a ground contact forming body of the connector or between the two half-shells, the resulting impedance is calculated on the basis of the distance between the conductive core of each of the wires and the electrical ground (ground contact forming body or two half-shells).

Now, this distance is relatively large, hence an increased impedance.

Thus, by virtue of the impedance matching part according to the invention, the excessive electrical impedance caused by the removal of the metal strip and/or braid is substantially decreased.

Consequently, the matching part according to the invention makes it possible to maintain the integrity of the electrical signal from the cable to the connector subassembly or to a conventional connector.

To better guarantee the continuity of the electrical signal, this matching part has a zone of physical contact with the electrical ground of the body or of the two half-shells. This contact zone could be obtained by pressing the body or the two half-shells onto said part or by soldering between the matching part and the body or the two half-shells.

One subsequent advantage provided by the matching part according to the invention is that it may be used as a guide for the wires of the cable in order to correctly positioned their conductive cores with respect to the central contacts before crimping them. This increases the ease of assembly between cable and connector.

The final subject of the invention is an assembly comprising:
- a connector, comprising:
  - an electrically conductive body;
  - an electrically insulating block, housed in the conductive body;
  - at least two central contacts, which are inserted into the insulating block, each central contact comprising a crimping portion;
- the electrical cable comprising the pair of twisted wires is a pair of insulated wires, each consisting of an electrically conductive core coated with an electrically insulating layer, and which are housed in a protective sheath, each conductive core being crimped inside the crimping portion of a central contact;
- the electrical conductive part forming an electrical matching part as described above, the cavities of which surround the electrically insulating layers of the wires and the fins of which are around the electrically insulating layers according to their curvature.

The fins are essentially cylindrical housing which conform as closely as the shape of the electrical insulating layers of the cable wires.

According to a first embodiment, the assembly comprises two electrically conductive half-shells that are assembled together around the conductive body, the central contacts, a portion of the cable beyond the stripped ends of the crimped wires and the matching part, which makes electrical contact with at least one of the two half-shells.

According to a second embodiment, the assembly comprises an electrically conductive body, forming a ground contact, which is positioned around the conductive body, the central contacts, a portion of the electrical cable beyond the stripped ends of the crimped wires and the matching part, which makes electrical contact with the body.

According to this second embodiment, and an advantageous variant, the matching part is in physical contact with the ground contact, in order to ensure the electrical continuity of the ground.

The invention finally relates to a method for mounting an electrical conductive part as described above forming an electrical matching part in a connector when connecting it with an electrical cable comprising at least one pair of twisted electrical wires, the method comprising the following steps:

a'/: once the ends of the wire cores of the electrical cable are stripped and those separated from one another, the electrical matching part is placed over the wire cores such that the cavities of the front portion of the part conform to the shape of the electrically insulating layers of the cable wires as closely as possible;

a''/: the electrical matching part is pressed around the electrically insulating layers so as to bring the cavities closer together and to bring them into direct contact with the electrically insulating layers, and, at the rear of the part, and such that the fins conform to the curves of the electrically insulating layers;

a'''/: each of the stripped wire ends of the pair of the twisted electrical wires of the electrical cable is placed in the crimping portion of a pre-mounted central contact of the subassembly.

DETAILED DESCRIPTION

Other advantages and features of the invention will become more apparent upon reading the detailed description of exemplary implementations of the invention, given by way of nonlimiting illustration, and with reference to the following figures, in which.

FIGS. 1A, 1B and 2 relating to a connector according to the prior art have been described in the preamble. They will therefore not be discussed below.

It is specified here that, throughout the present application, the terms "lower", "upper", "above", "below", "inside", "outside", "inner" and "outer" are to be understood with reference to a connector according to the invention in a substantially horizontal configuration.

A connector 1 according to the invention first comprises a pre-mounted subassembly 2.

Figure 16:
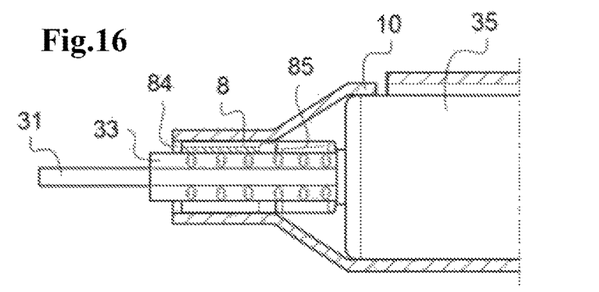
FIG. 16 is a longitudinal sectional view of a cable resulting from the steps according to FIGS. 15A to 15C, with the insertion of an impedance matching part according to the invention.
Figure 16A:
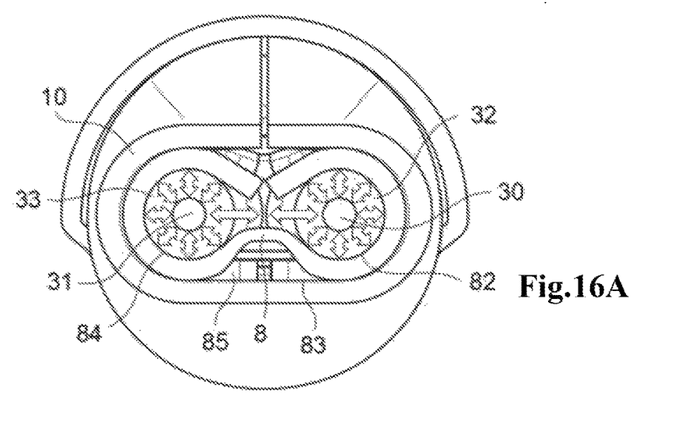
FIG. 16A is a cross-sectional view of a cable according to FIG. 16.

This subassembly 2 is intended to be connected to and mounted on a cable 3 with wires 30, 31 that are insulated from one another as illustrated in FIGS. 16A to 16C. More specifically, in the illustrated examples, this cable 3 comprises two wires, each consisting of an electrically conductive core 30, 31 that is coated with an electrically insulating layer 32, 33, and housed in a protective sheath 36. The wires are, by construction, surrounded by a metal strip 34 and by a metal braid 35 ending at the end of the cable 3.

This connector subassembly 2 comprises a metal body 20 holding within itself an electrically insulating block 21 into which central contacts 22, 23 are inserted comprising crimping portions 24, 25, which extend by protruding rearward from the insulating block 21.

Figure 3:
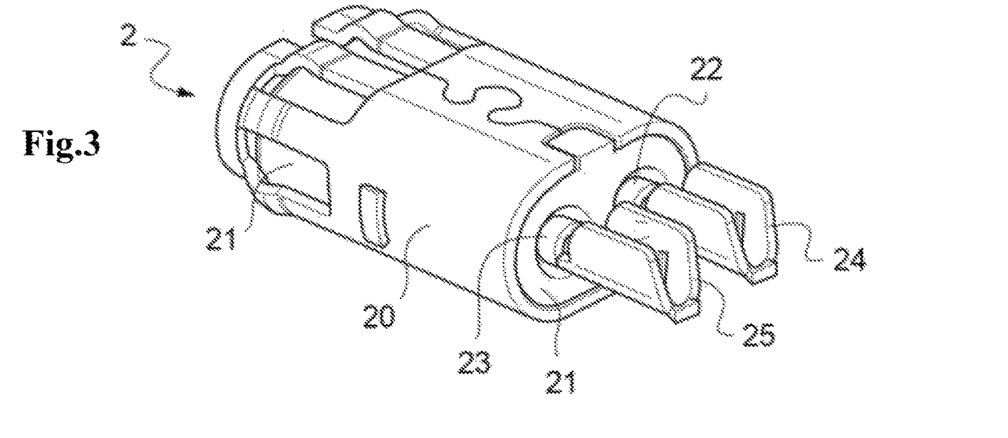
FIG. 3 is a perspective view of an example of a connector subassembly with crimped central contacts according to the prior art.

As can be seen in FIG. 3, in the pre-mounted state and before crimping of the central contacts 22, 23, the protruding crimping portions 24, 25 of the latter are completely clear of the other components 20, 21 of the subassembly 2. In other words, their periphery is free of any surrounding parts, which will allow the portions 24, 25 to be crimped using broad crimping jaws, as explained below.

Figure 4:
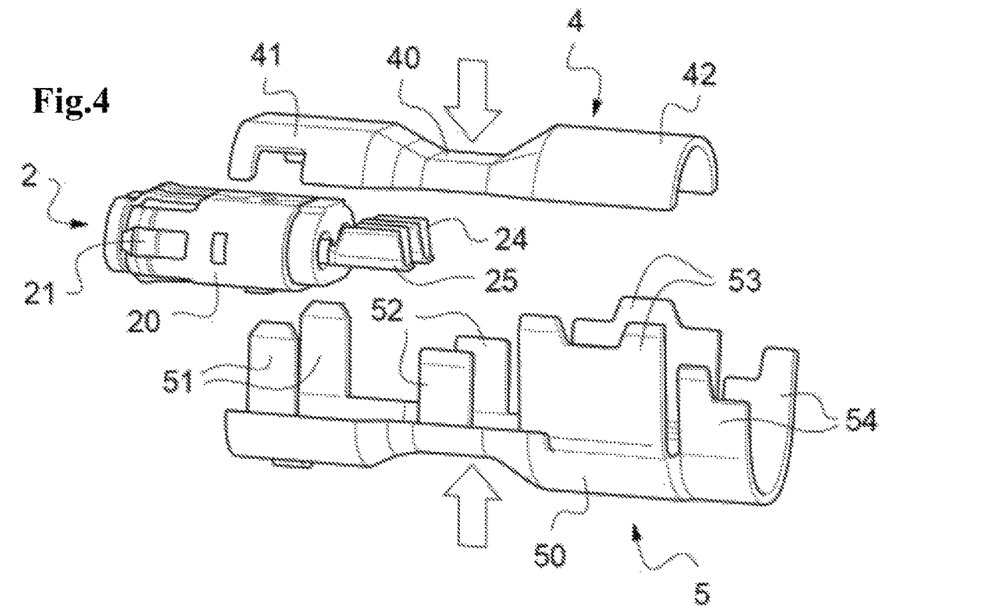
FIG. 4 is a perspective and exploded view of a connector according to the invention with the subassembly and the two half-shells to be assembled together around the conductive body of the subassembly and a cable, the wires of which are to be crimped inside the central contacts of the subassembly.

As illustrated in FIG. 4, the connector 1 according to the invention also comprises two metal half-shells 4, 5 that are intended to be assembled together around the conductive body 20, the central contacts 22, 23 and a portion of the cable beyond the stripped ends of the wires 30, 31, once the crimping portions 24, 25 of the contacts have been crimped around the stripped ends of the wires.

The upper half-shell 4 comprises a hollow body 40, the front of which has indentations 41.

The lower half-shell 5 comprises a hollow body 50 which comprises, from the front to the rear, respectively, first 51, second 52 and third 53 pairs of attachment lugs for attachment to the body 40 of the upper half-shell 4 by crimping. The function of the first and second crimping pairs 51, 52 is to assemble the two bodies 40, 50 together while the third pair 53 has the additional function of grounding the two half shells 4, 5 by pressing on the metal braid 35 at the level of the rear portion 42 of the upper half-shell 4.

The upper half-shell 5 further comprises, at the rear of its hollow body 50, a pair of attachment lugs 54 for attachment by crimping around the sheath 36 of the cable.

Figure 5:
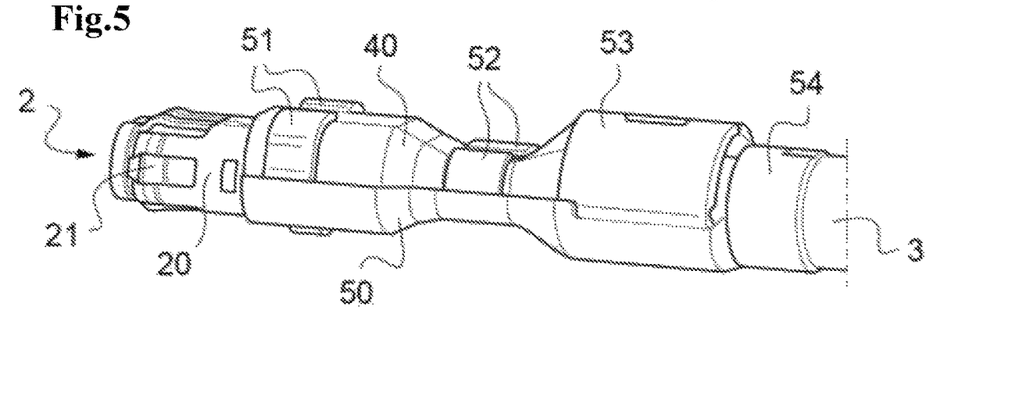
FIG. 5 is a perspective view of the connector according to FIG. 4 but with the two half-shells assembled together by crimping.

FIG. 5 shows a connector 1 according to the invention with the two half-shells 4, 5 assembled together via the various pairs of lugs 51, 52, 53, 54 crimped around the conductive body 20 and the crimped central contacts 22, 23 of the subassembly 2 and around the cable 3.

Figure 6A:
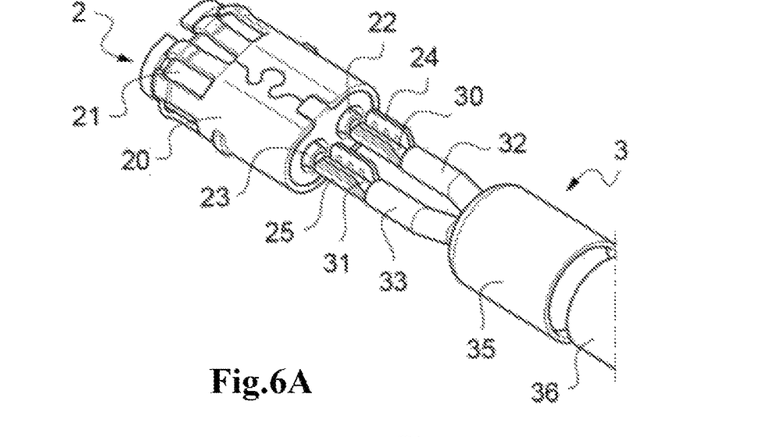
FIGS. 6A to 6E are perspective views showing the various steps of mounting a connector according to the invention to a cable with wires to be crimped inside the central contacts of the connector subassembly.
Figures 6B, 6C:
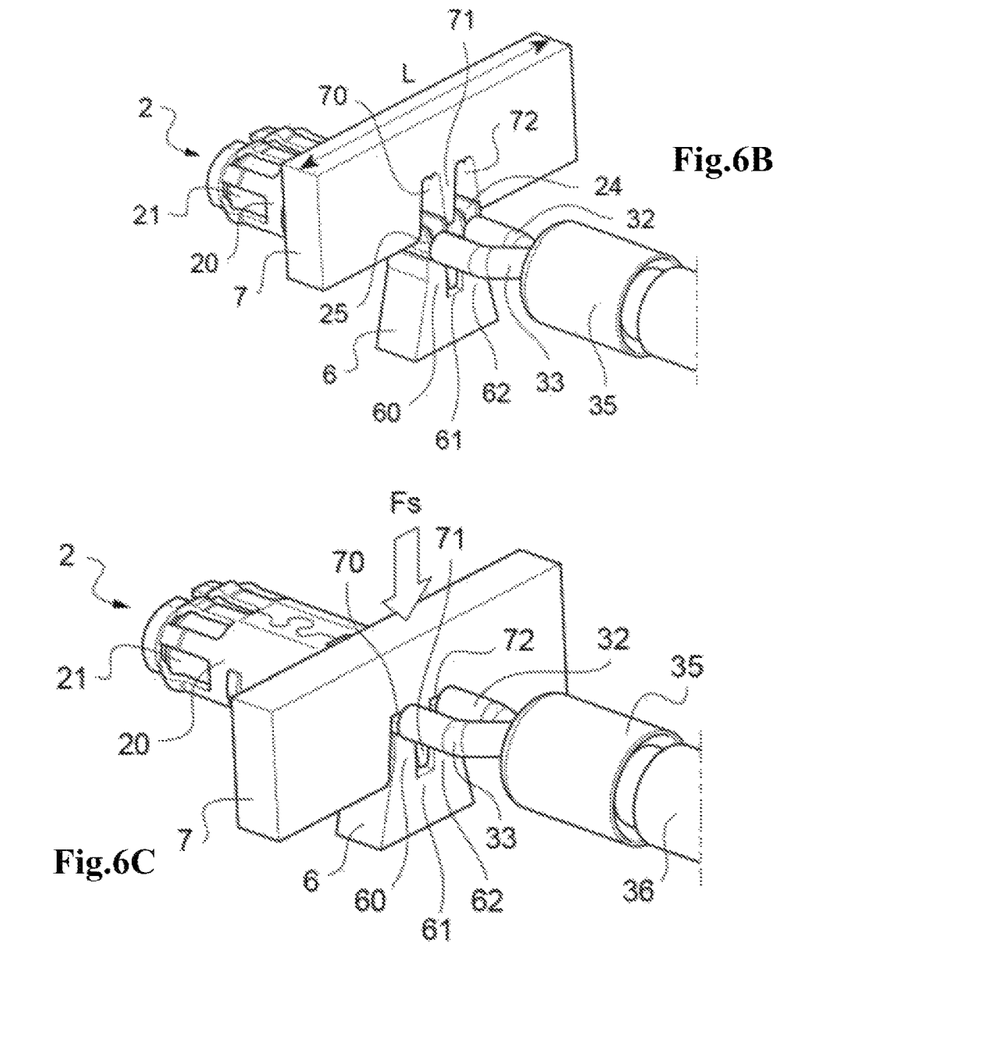

The various steps of mounting a cable 3 in a connector 1 according the invention are now described with reference to FIGS. 6A to 7.

Step a/: After having stripped the ends of the wires 30, 31 of the cable and having separated them from one another, each of these ends is placed in the crimping portion 24, 25 of a pre-mounted central contact 22, 23 of the subassembly 2 (FIG. 6A).

Step b/: The central contacts 22, 23 are then positioned on a lower crimping jaw 6 (FIG. 6B).

More specifically, the crimping portions 24, 25 of the central contacts 22, 23 are positioned so as to bear against stops 60, 62 of the lower jaw 6 which are separated by a groove 61.

Step c/: An upper crimping jaw 7 is then moved toward and over the lower crimping jaw 6 with a crimping force Fs so as to crimp the central contacts 21, 22 around the stripped wire ends 30, 31 (FIG. 6C).

More specifically, the upper jaw 7 comprises two crimping grooves 70, 72 which are separated by a rib 71, the shape of which is complementary to the groove 61 of the lower jaw 6. As the upper jaw 7 moves toward the lower jaw 6, the crimping grooves cause the plastic deformation of the crimping portions 24, 25 of the central contacts 22, 23, folding them around themselves and imprisoning the stripped portions 30, 31 of the wires.

Step d/: Once the stripped portions 30, 31 of the wires have been crimped in the central contacts 22, 23, the two half-shells 4, 5 are positioned around the conductive body 20 and the crimped central contacts 22, 23 and a portion of the cable beyond the stripped ends of the wires (FIGS. 6D, 6E).

Step e/: The assembly of the connector 1 with the cable 3 is then finished by assembling the two half-shells 4, 5 together by crimping.

Figure 6D:
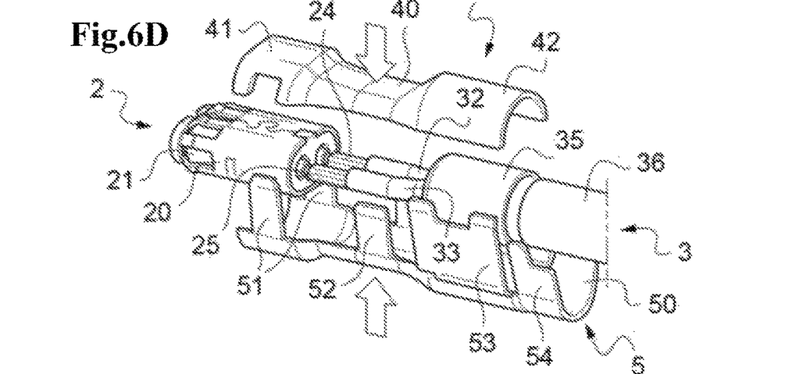
Figure 6E:
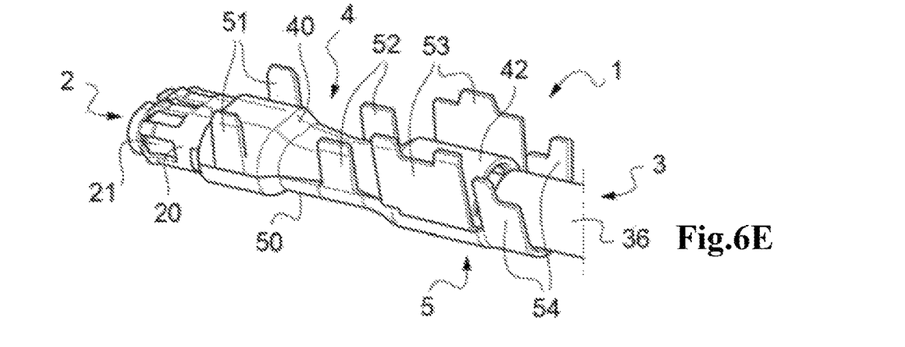
Figure 7:
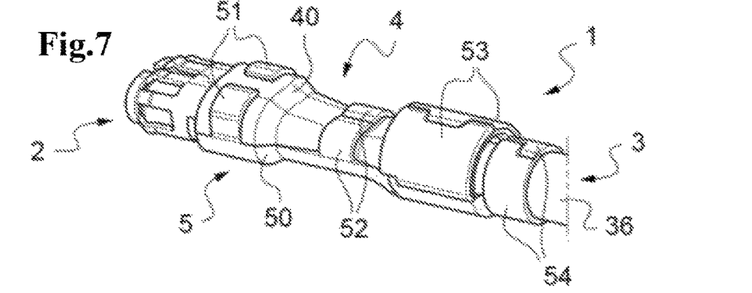
FIG. 7 is a perspective view showing the connector mounted on the cable resulting from the steps according to FIGS. 6A to 6E.

More specifically, the various pairs of crimping lugs 51, 52, 53, 54 of the lower half-shell 5 are crimped via the plastic deformation of the various pairs of crimping lugs in order to fold them around the body 40 of the upper half-shell 4 and the metal braid 35 of the cable 3 (FIG. 6D). The cable 3 is then compressed by the crimping lug pair 53 and the rear portion 42 of the upper half-shell 4 and held mechanically by the rear crimping pair 54.

Figure 8:
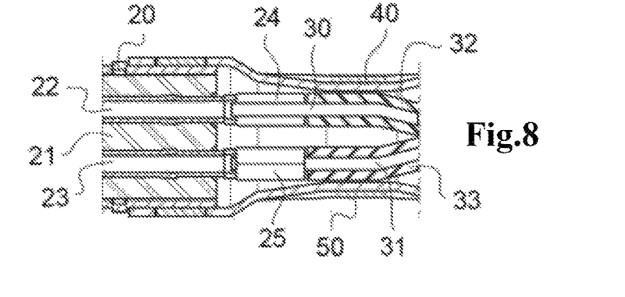
FIG. 8 is a longitudinal sectional view of FIG. 7, at the level of the portions of the central contacts crimped around the stripped wires of the cable.

FIG. 8 shows that once assembly has been carried out, the inside of the two half-shells 4, 5 conforms as closely as possible to the rear portions 24, 25 of the central contacts 22, 23 and of the cores 30, 31 of the wires surrounded by their electrical insulators 32, 33. The electrical impedance is thus optimally matched, thereby allowing an improved transmission of the signals carried from or to the wires 30, 31 of the cable 3, with an increase in electrical performance.

Figure 9:
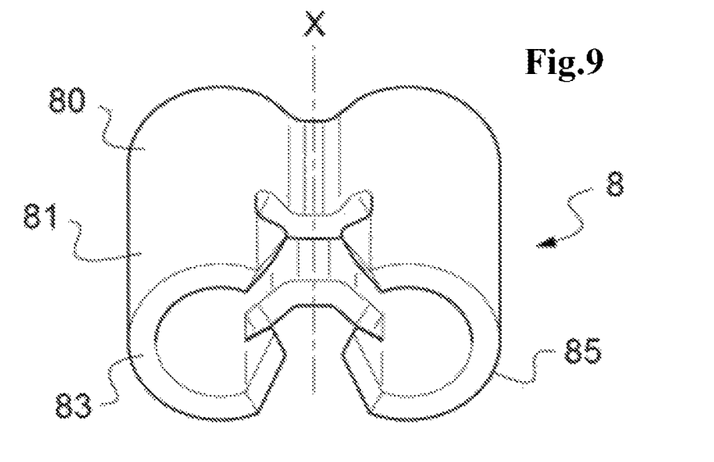
FIG. 9 is a perspective view of the rear of an electrical impedance matching part according to the invention, before and after the mounting thereof in a connector electrical ground contact forming body or in the space between the two assembled half-shells.

To further strengthen impedance matching, the inventors have designed the impedance matching part 8 such as shown in FIG. 9. Once placed inside the space at the rear, between the two metal half-shells 4, 5, this part 8 makes it possible to form a continuity of electrical ground closer to the cable 3, making it possible to maintain the integrity of the electrical signals carried from or to the wires 30, 31 of the cable 3.

This impedance matching part 8 lies along a longitudinal axis X and comprises:
- a front portion 80 comprising two cavities 82, 84, the shape of which has a continuous outer profile and which defines on the inside two cylindrical cavities 82, 84, each of which is suitable for housing the unstripped portion of a cable wire 32, 33;
- a rear portion 81, extending from the front portion, the shape of which has a discontinuous outer profile defined by fins 83, 85 taking a shape that is complementary to that of the unstripped portion of the wire of a cable 32, 33.

In the illustrated example, the cylindrical cavities 82, 84 are contiguous via an open space. It is of course possible to envisage having two distinct cavities 82, 84 separated by a rib.

The fins 83, 85 are essentially cylindrical housing which conform as closely as the shape of the electrical insulating of the cable wires 32, 33.

The various steps of mounting a cable 3 in a connector 1 according the invention with the insertion of an impedance matching part 8 according to the invention are now described with reference to FIGS. 10A to 10G.

Figure 10A:
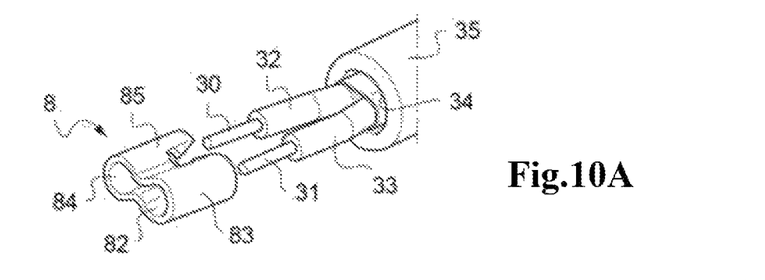
FIGS. 10A to 10G are perspective views showing the various steps of mounting a connector and of an impedance matching part according to the invention to a cable with wires to be crimped inside the central contacts of the connector subassembly.

Step a'/: After having stripped the ends of the wires 30, 31 of the cable and having separated them from one another, the part 8 is placed over the wire cores 30, 31 (FIG. 10A).

More specifically, the cylindrical cavities 82, 84 conform to the shape of the electrical insulators 32, 33 of the cable wires as closely as possible.

Figure 10B:
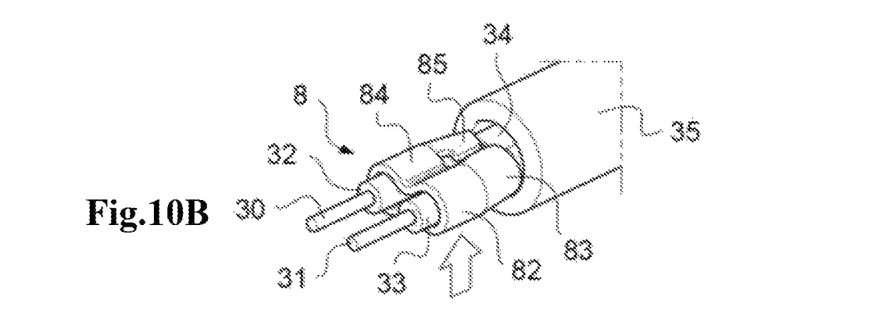

Step a'': The matching part 8 is then pressed around the insulators 32, 33. More specifically, at the front 80 of the part, the space between the cylindrical cavities 82, 84 is squeezed so as to bring them closer together and to bring them into direct contact with the insulators 32, 33, and, at the rear 81, the fins 83, 85 are folded over the insulators 32, 33 by deformation of the fins such that they conform to the curves of the latter while making contact therewith (FIG. 10B).

Figure 10C:
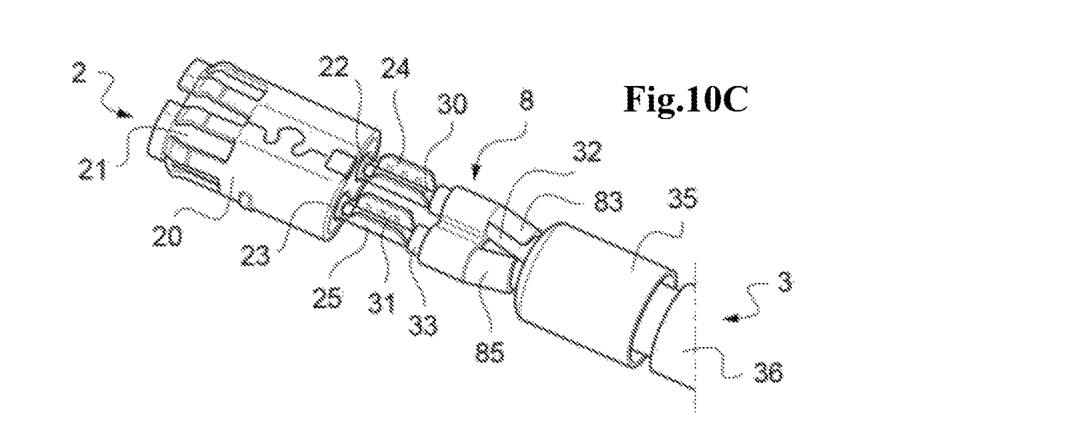

Step a''': Each of these stripped wire ends 30, 31 is then positioned in the crimping portion 24, 25 of a central contact 22, 23 of the subassembly 2, the matching part being compressed at the rear (FIG. 10C).

Figure 10D:
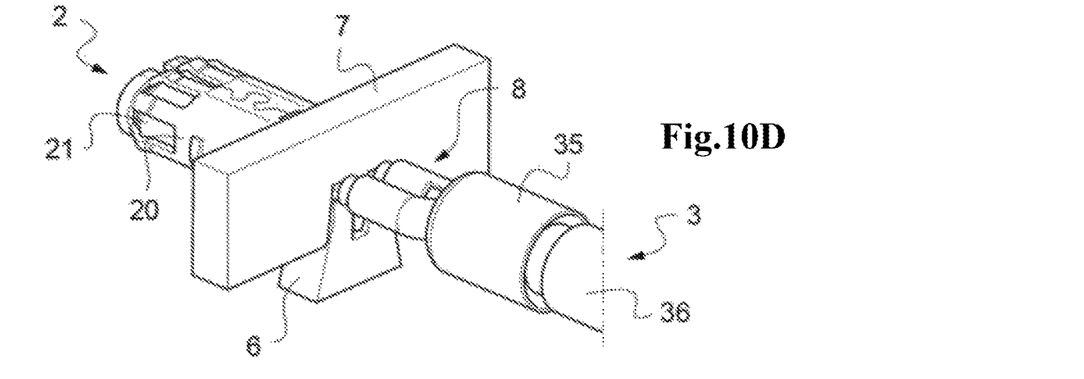

Step b'/: The central contacts 22, 23 are then positioned on a lower crimping jaw 6, with the part 8 clear of the jaw 6 (FIG. 10D).

More specifically, the crimping portions 24, 25 of the central contacts 22, 23 are positioned so as to bear against stops 60, 62 of the lower jaw 6 which are separated by a groove 61.

Step c'/: An upper crimping jaw 7 is then moved toward and over the lower crimping jaw 6 with a crimping force Fs so as to crimp the central contacts 21, 22 around the stripped wire ends 30, 31 (FIG. 10D).

More specifically, the upper jaw 7 comprises two crimping grooves 70, 72 which are separated by a rib 71, the shape of which is complementary to the groove 61 of the lower jaw 6. As the upper jaw 7 moves toward the lower jaw 6, the crimping grooves cause the plastic deformation of the crimping portions 24, 25 of the central contacts 22, 23, folding them around themselves and imprisoning the stripped portions 30, 31 of the wires without damaging the matching part, which is clear of the space between the jaws 6, 7.

Figure 10E:
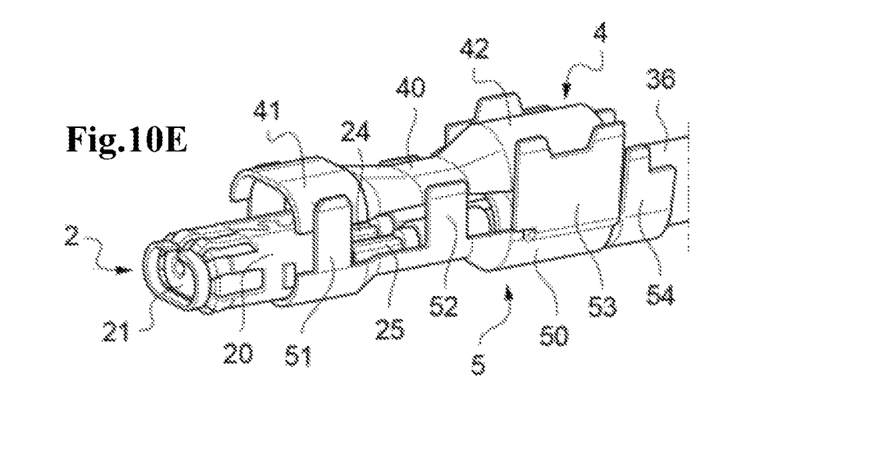
Figure 10F:
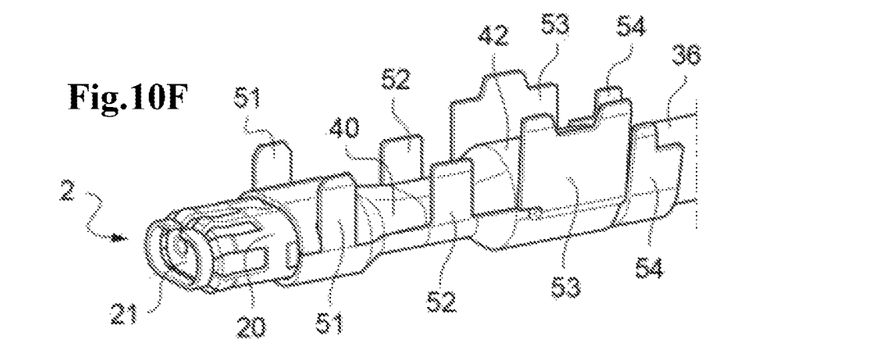

Step d'/: Once the stripped portions 30, 31 of the wires have been crimped in the central contacts 22, 23, the two half-shells 4, 5 are positioned around the conductive body 20 and the crimped central contacts 22, 23 and a portion of the cable beyond the stripped ends of the wires (FIGS. 10E, 10F).

Figure 10G:
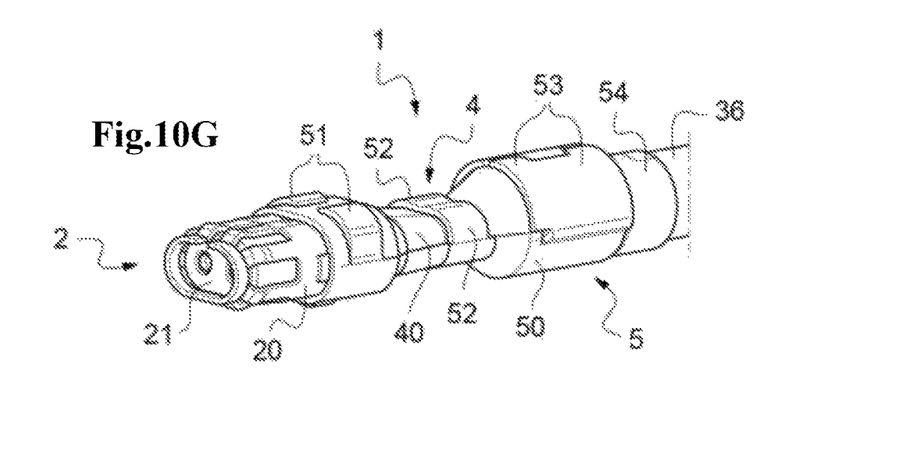

Step e'/: The assembly of the connector 1 with the cable 3 is then finished by assembling the two half-shells 4, 5 together by crimping.

More specifically, the various pairs of crimping lugs 51, 52, 53, 54 of the lower half-shell 5 are crimped via the plastic deformation of the various pairs of crimping lugs in order to fold them around the body 40 of the upper half-shell 4 and the metal braid 35 of the cable 3 (FIG. 10G). The cable 3 is then compressed by the crimping lug pair 53 and held mechanically by the rear crimping pair 54.

Figure 11:
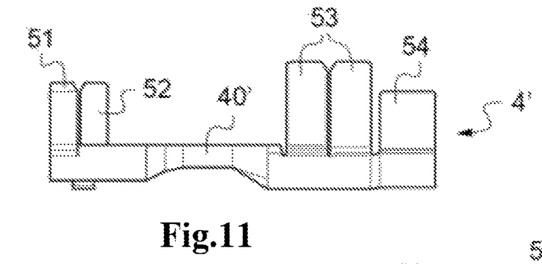
FIGS. 11 and 12 are perspective views showing a variant embodiment of the two half-shells according to the invention.
Figure 12:
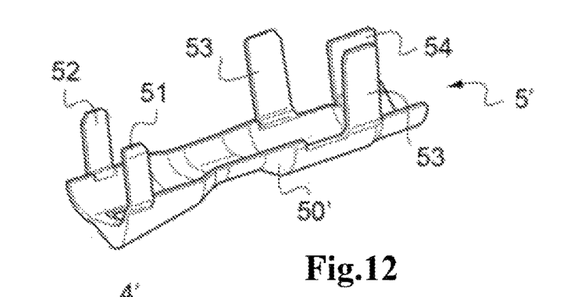

FIGS. 11 and 10 show a variant embodiment of the two half-shells 4', 5', in which the hollow body 40', 50' of each half-shell bears one of the pairs of crimping lugs 51, 52, 53, 54.

Figure 13A:
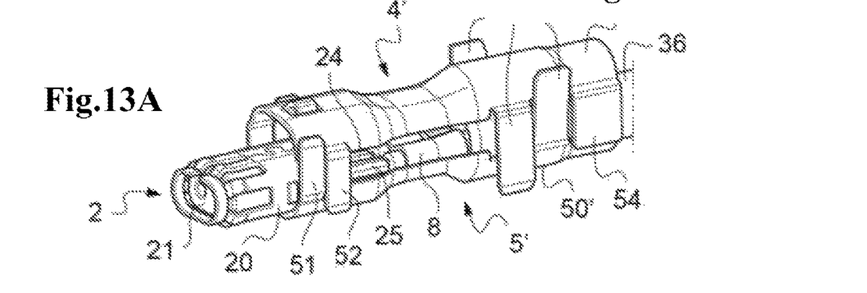
FIGS. 13A and 13B are perspective views showing the steps of assembling, by crimping, the two half-shells according to FIGS. 11 and 12 around the conductive body and the central contacts of the connector and around the cable with wires crimped in the central contacts.
Figure 13B:
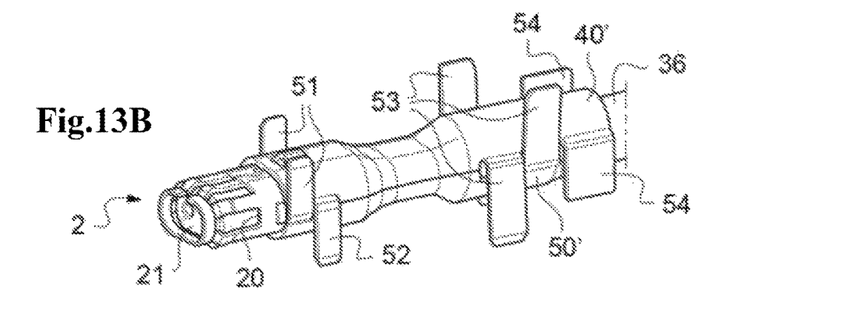

FIGS. 13A and 13B show, in a similar way to FIGS. 10E and 10F, the assembly of these two half-shells 4', 5' together by crimping the crimping lugs 51, 52, 53, 54 around the conductive body 20 and the central contacts 22, 23 of the subassembly 2, the wires with their cores 30, 31 and their insulators 32, 33, the impedance matching part 8 and the metal braid 35 of the cable.

Figure 14:
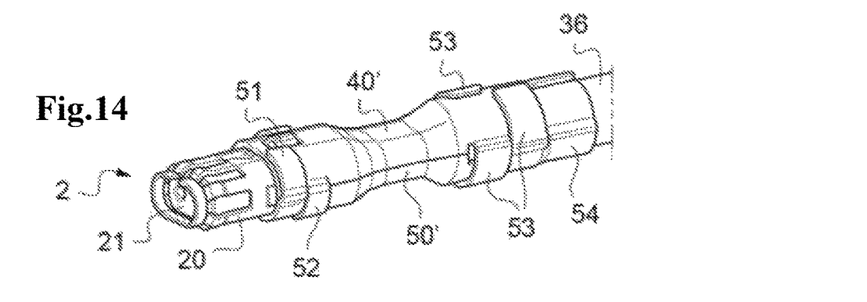
FIG. 14 is a perspective view showing the connector mounted on the cable resulting from the steps according to FIGS. 13A and 13B.

FIG. 14 shows the connector 1 once it has been mounted on the cable 3 with the two half-shells 4', 5' assembled together.

Figure 15A:
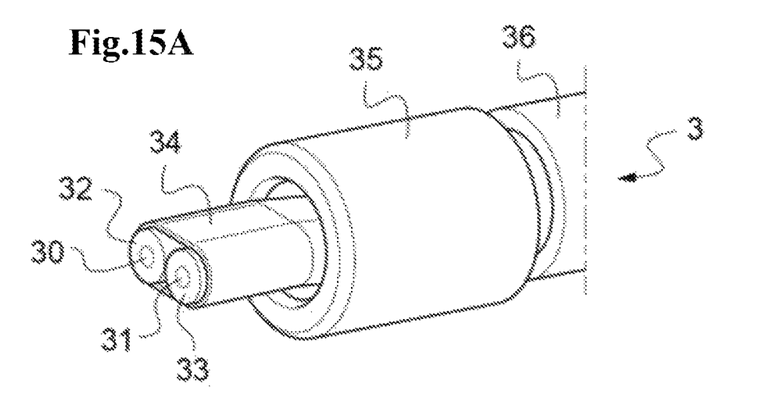
FIGS. 15A to 15C are perspective views showing the various steps of preparing a cable with wires to be crimped.
Figure 15B:
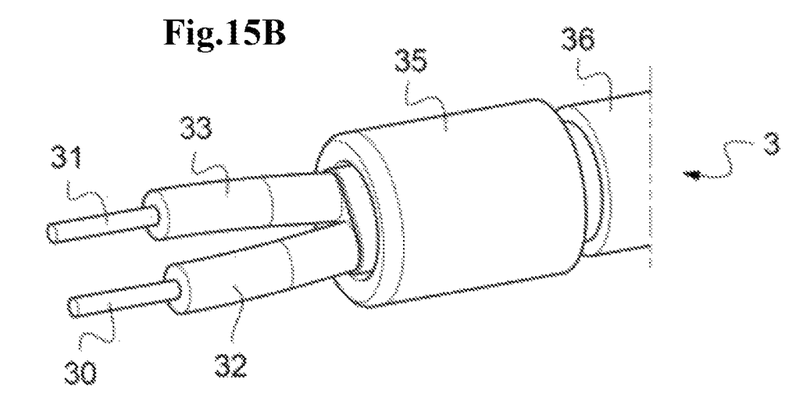
Figure 15C:
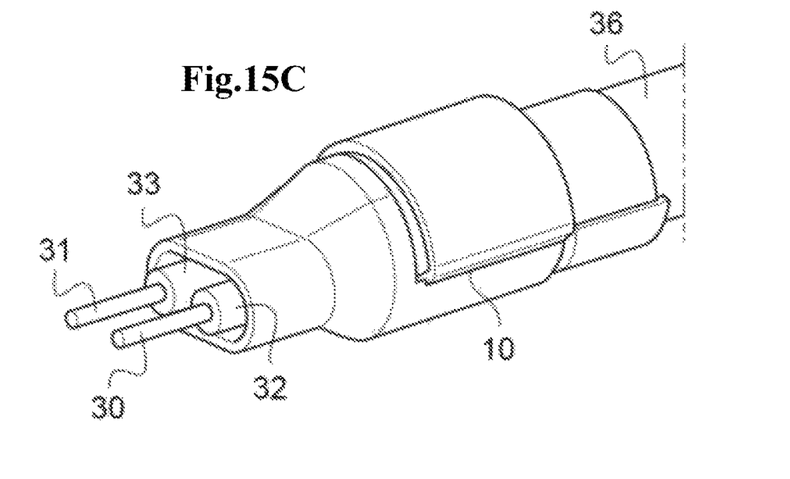

FIGS. 15A to 15C show the various steps of mounting a matching part 8 according to the invention in an electrical ground contact forming body 10 of a cable 3 for a conventional connector, without half-shells.

The metal strip 34 initially surrounds the insulators 32, 33 of the conductive cores (FIG. 15A).

After having removed this strip 34 and stripped the ends of the wires 30, 31, they are separated from one another (FIG. 15B).

The electrical matching part is then put in place as above, and a ground contact forming body 10 is placed therearound (FIG. 15C).

FIGS. 16 and 16A illustrate the resulting assembly.

Figure 17:
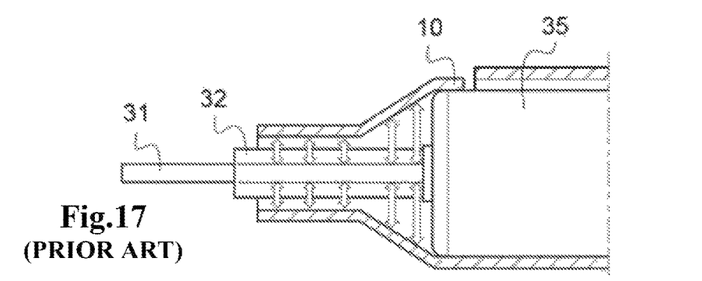
FIG. 17 is a longitudinal sectional view of a cable according to the prior art, i.e. without an impedance matching part according to the invention.
Figure 17A:
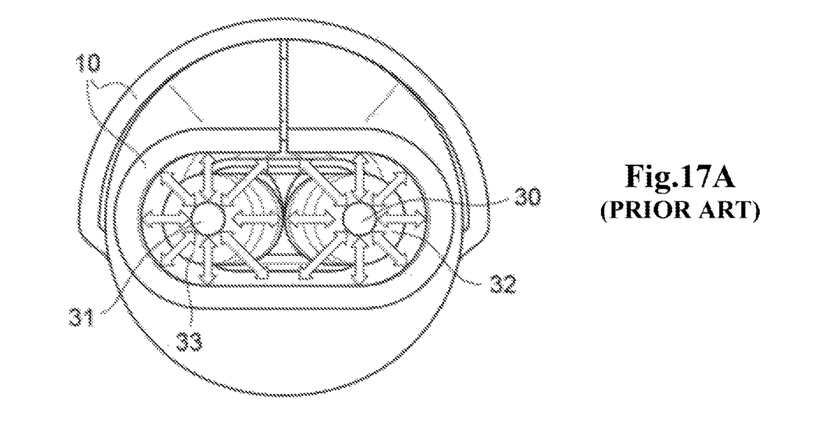
FIG. 17A is a cross-sectional view of a cable according to FIG. 17.

The metal matching part 8 allows ground continuity to be established, since the ground is as close as possible to the cable 3, as symbolically represented by the arrows in FIGS. 16 and 16A. The integrity of the electrical signal is therefore maintained, unlike in the configuration of the prior art illustrated in FIGS. 17 and 17A, in which it can clearly be seen that in the absence of this part the ground walls 10 are further away from the conductive cores 30, 31, and consequently impedance matching is not optimized.

As shown in FIGS. 16 and 16A, the matching part has a zone of physical contact with the ground contact forming body 10, thereby guaranteeing continuity of the electrical signal. This contact zone could be obtained by pressing the ground contact forming body 10 onto the part 8 or by soldering between them.

Other variants and advantages of the invention may be realized without actually departing from the scope of the invention.

The invention is not limited to the examples that have just been described; it is possible in particular to combine features of the examples illustrated with one another in variants that are not illustrated.

The invention claimed is:

1. An electrically conductive part configured to provide electrical impedance matching when connecting a connector with an electrical cable; comprising at least one pair of twisted electrical wires, comprising:
   a front portion including at least two cavities, each of which is suitable for housing the unstripped portion of one of the pair of twisted electrical wires of the cable;
   a rear portion, extending from the front portion, including fins taking a shape that is complementary to that of the unstripped portion of the one of the pair of twisted electrical wires of the cable.

2. The electrically conductive part as claimed in claim 1, wherein the cavities are contiguous with an open space between them.

3. The electrically conductive part as claimed in claim 1, wherein the front portion substantially takes the shape of an eight.

4. An assembly comprising:
   a connector, comprising:
      an electrically conductive body;
      an electrically insulating block, housed in the conductive body;
      at least two central contacts, which are inserted into the insulating block, each central contact comprising a crimping portion;
   the electrical cable, wherein the pair of twisted wires is a pair of two insulated wires, each consisting of an electrically conductive core coated with an electrically insulating layer, and which are housed in a protective sheath, each conductive core being crimped inside the crimping portion of a central contact;
   the electrical conductive part as claimed in claim 1, forming an electrical matching part, the cavities of which surround the electrically insulating layers of the wires and the fins of which are around the electrically insulating layers according to their curvature.

5. The assembly as claimed in claim 4, comprising two electrically conductive half-shells that are assembled together around the conductive body, the central contacts, a portion of the cable beyond the stripped ends of the crimped wires and the matching part, which makes electrical contact with at least one of the two half-shells.

6. The assembly as claimed in claim 4, comprising an electrically conductive body, forming a ground contact, which is positioned around the conductive body, the central contacts, a portion of the electrical cable beyond the stripped ends of the crimped wires and the matching part, which makes electrical contact with the body.

7. The assembly as claimed in claim 6, wherein the electrical matching part is in physical contact with the ground contact in order to ensure the electrical continuity of the ground.

8. A method for mounting the electrical conductive part of claim 1, the electrical conductive part forming an electrical matching part, the method comprising the following steps:
   a'/: once the ends of the wire cores of the electrical cable are stripped, and those separated from one another, placing the electrical matching part over the wire cores such that the cavities of the front portion of the part conform to the shape of the electrically insulating layers of the cable wires as closely as possible;
   a''/: pressing the electrical matching part around the electrically insulating layers so as to bring the cavities closer together and to bring them into direct contact with the electrically insulating layers, and, at the rear of the part, and such that the fins conform to the curves of the electrically insulating layers;
   a'''/: placing each of the stripped wire ends of the pair of the twisted electrical wires of the electrical cable in the crimping portion of a pre-mounted central contact of the subassembly.

* * * * *

UNITED STATES PATENT AND TRADEMARK OFFICE
CERTIFICATE OF CORRECTION

PATENT NO. : 10,700,480 B2
APPLICATION NO. : 16/208932
DATED : June 30, 2020
INVENTOR(S) : Sébastien Annequin It is certified that error appears in the above-identified patent and that said Letters Patent is hereby corrected as shown below:

In the Claims

Column 9, Line 14, Claim 1, "eletrical cable; comprising" should be -- electric cable comprising --

Signed and Sealed this
Seventeenth Day of May, 2022

Katherine Kelly Vidal
*Director of the United States Patent and Trademark Office*